US011915765B2

(12) United States Patent
Hirayama

(10) Patent No.: US 11,915,765 B2
(45) Date of Patent: *Feb. 27, 2024

(54) SEMICONDUCTOR STORAGE DEVICE

(71) Applicant: KIOXIA CORPORATION, Tokyo (JP)

(72) Inventor: Kazunori Hirayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/979,360

(22) Filed: Nov. 2, 2022

(65) Prior Publication Data

US 2023/0047685 A1 Feb. 16, 2023

Related U.S. Application Data

(63) Continuation of application No. 17/183,796, filed on Feb. 24, 2021, now Pat. No. 11,521,685.

(30) Foreign Application Priority Data

Jul. 13, 2020 (JP) .................. 2020-120115

(51) Int. Cl.
G11C 16/10 (2006.01)
G11C 16/26 (2006.01)
G11C 16/04 (2006.01)
G11C 16/30 (2006.01)

(52) U.S. Cl.
CPC .......... *G11C 16/10* (2013.01); *G11C 16/0483* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | | |
|---|---|---|---|---|
| 4,390,844 A | * | 6/1983 | Ting | G11C 27/026 |
| | | | | 327/345 |
| 5,864,252 A | * | 1/1999 | Tran | G11C 7/1066 |
| | | | | 327/144 |
| 5,912,858 A | * | 6/1999 | Tomita | G11C 7/1078 |
| | | | | 365/191 |
| 6,185,119 B1 | | 2/2001 | Haeberli et al. | |
| 8,976,582 B2 | | 3/2015 | Sarin et al. | |
| 10,553,283 B2 | | 2/2020 | Deguchi et al. | |
| 10,706,940 B2 | | 7/2020 | Handa et al. | |
| 10,762,963 B2 | | 9/2020 | Shimizu et al. | |

(Continued)

FOREIGN PATENT DOCUMENTS

| | | |
|---|---|---|
| JP | 2019-117676 A | 7/2019 |
| JP | 2019-197603 A | 11/2019 |
| JP | 2019-200828 A | 11/2019 |

*Primary Examiner* — Tan T. Nguyen

(74) *Attorney, Agent, or Firm* — Kim & Stewart LLP

(57) ABSTRACT

A semiconductor storage device includes a memory cell array, a peripheral circuit configured to perform writing of data to the memory cell array and reading of data from the memory cell array, and a sampling circuit configured to execute a sampling process by which sampling data is collected from a predetermined node of the peripheral circuit, during a period in which the peripheral circuit performs the writing of data to the memory cell array or the reading of data from the memory cell array.

18 Claims, 8 Drawing Sheets

(56) References Cited

U.S. PATENT DOCUMENTS

| | | | |
|---|---|---|---|
| 11,521,685 B2* | 12/2022 | Hirayama | G11C 16/0483 |
| 2007/0014137 A1 | 1/2007 | Mellinger et al. | |
| 2012/0113728 A1* | 5/2012 | Kwon | G11C 7/1087 |
| | | | 365/189.05 |
| 2014/0042300 A1 | 2/2014 | Hsu | |
| 2018/0174636 A1 | 6/2018 | Jeon et al. | |

* cited by examiner

SEMICONDUCTOR STORAGE DEVICE

CROSS-REFERENCE TO RELATED APPLICATIONS

This application is a continuation application of U.S. patent application Ser. No. 17/183,796, filed Feb. 24, 2021, which is based upon and claims the benefit of priority from Japanese Patent Application No. 2020-120115, filed Jul. 13, 2020, the entire contents of each of which are incorporated herein by reference.

FIELD

Embodiments described herein relate generally to a semiconductor storage device.

BACKGROUND

A semiconductor storage device such as a NAND type flash memory includes a memory cell array that stores data and a peripheral circuit unit that writes data to the memory cell array. When a defect occurs in the semiconductor storage device, it is required to specify a cause of the defect.

DETAILED DESCRIPTION

According to the present disclosure, it is possible to acquire information for specifying a cause of a defect.

In general, according to one embodiment, a semiconductor storage device includes a memory cell array, a peripheral circuit configured to perform writing of data to the memory cell array and reading of data from the memory cell array, and a sampling circuit configured to execute a sampling process by which sampling data is collected from a predetermined node of the peripheral circuit, during a period in which the peripheral circuit performs the writing of data to the memory cell array or the reading of data from the memory cell array.

Hereinafter, embodiments will be described with reference to the accompanying drawings. In order to facilitate understanding of the description, the same components in each drawing will be denoted by the same reference signs as much as possible, and duplicate description will be omitted.

Figure 1:
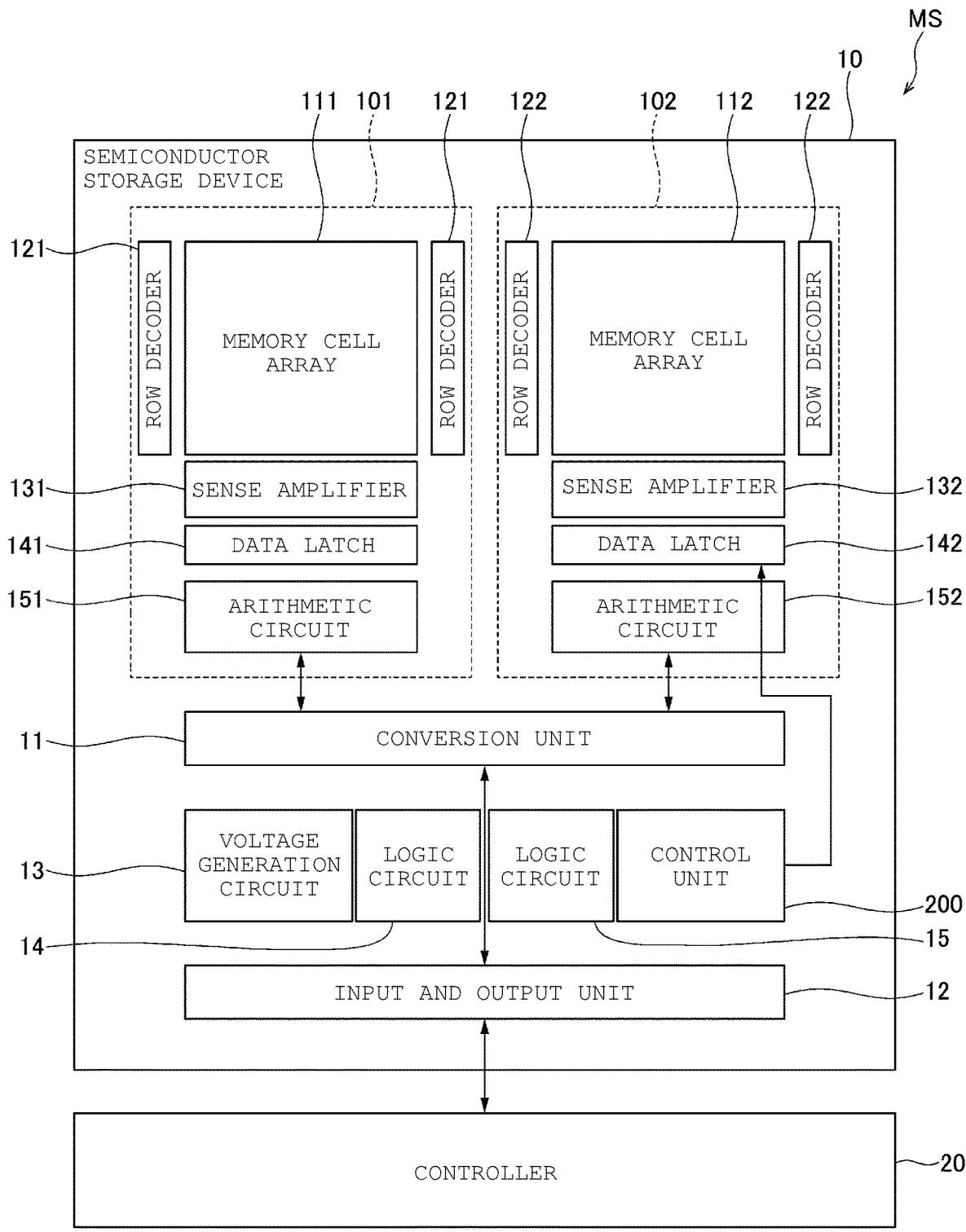
FIG. 1 is a diagram schematically illustrating a configuration of a semiconductor storage device according to a first embodiment.

The first embodiment will be described. A semiconductor storage device 10 according to the embodiment is a non-volatile storage device configured as a NAND type flash memory. As illustrated in FIG. 1, the semiconductor storage device 10 and a controller 20 are formed as a part of a memory system MS. The memory system MS is, for example, a memory card and an SSD mounted on a computer device. The memory system MS may be configured with a plurality of chips mounted on a motherboard which is not illustrated, or may be configured as a single module as one unit.

The controller 20 is a unit that performs necessary control for writing, reading, and erasing of data in the semiconductor storage device 10 in response to an instruction from a host device (not illustrated), which is connected to the memory system MS. In FIG. 1, the controller 20 and the semiconductor storage device 10 are schematically drawn as blocks separated from each other, and the controller 20 and the semiconductor storage device 10 may be configured as a device integrated with each other.

A specific configuration of the semiconductor storage device 10 will be described. The semiconductor storage device 10 includes memory cell arrays 111 and 112 for storing data, and a peripheral circuit unit that writes and reads data to and from the memory cell arrays 111 and 112. The peripheral circuit unit includes row decoders 121 and 122, sense amplifiers 131 and 132, and data latches 141 and 142, which will be described later.

First, a configuration of the memory cell arrays 111 and 112 will be described. Each of the memory cell arrays 111 and 112 is a unit having a plurality of memory cells for storing data. In the embodiment, the memory cell arrays 111 and 112 are provided respectively for planes 101 and 102 which are control units. The plane 101 may be referred to as a "first plane" in the description of the embodiment. The plane 102 may be referred to as a "second plane" in one example of the embodiment. The number of planes provided in the semiconductor storage device 10 may be two as shown in the embodiment, or may be three or more. In other words, the number of memory cell arrays provided in the semiconductor storage device 10 may be two as shown in the embodiment, or may be three or more.

Figure 2:
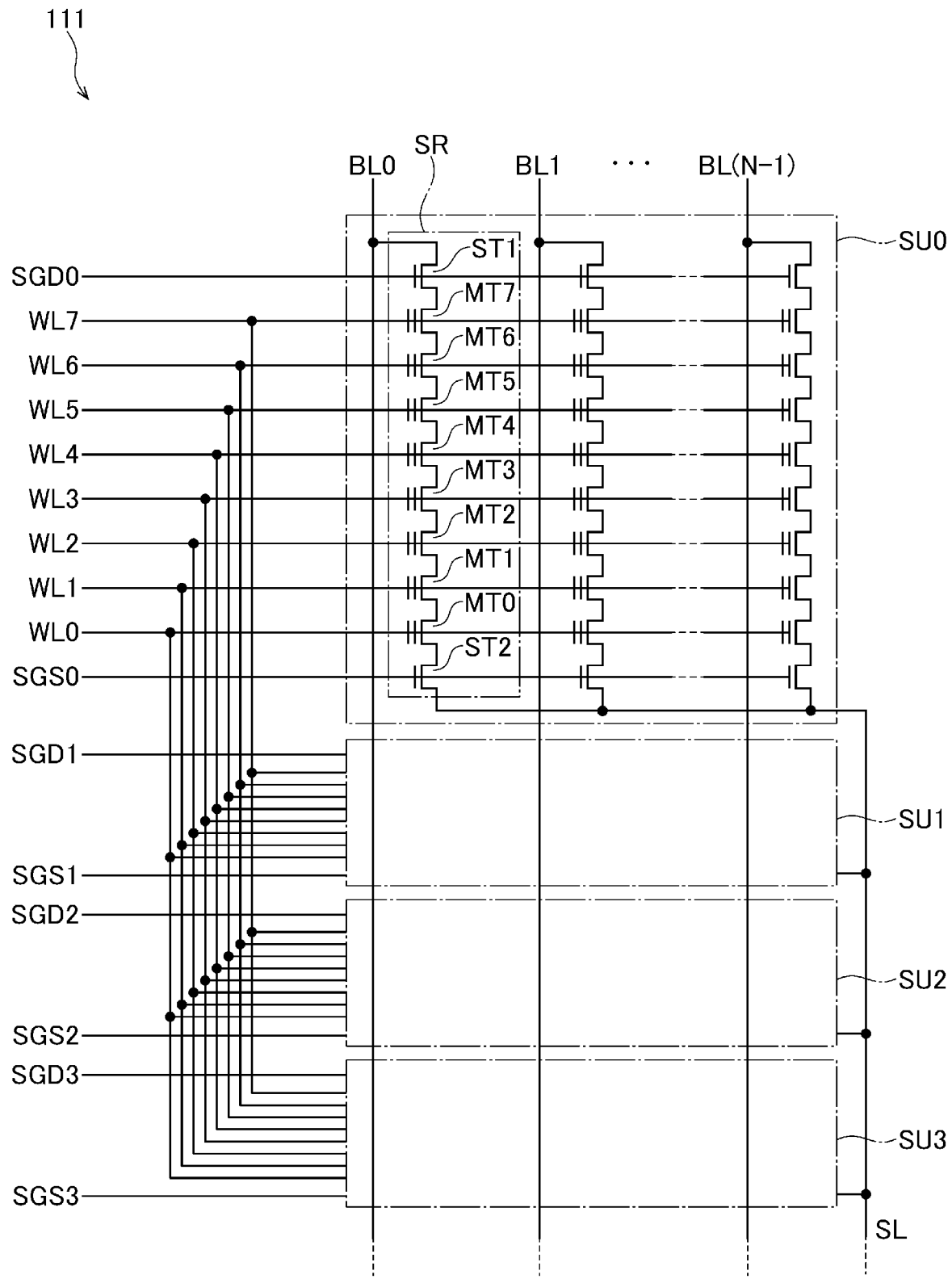
FIG. 2 is an equivalent circuit diagram of a memory cell array in the semiconductor storage device according to the first embodiment.

FIG. 2 illustrates a configuration of the memory cell array 111 as an equivalent circuit diagram. Since a configuration of the memory cell array 112 is the same as the configuration of the memory cell array 111, only the configuration of the memory cell array 111 will be described below.

The memory cell array 111 includes a plurality of string units SU0 to SU3. Each of the string units SU0 to SU3 includes a plurality of NAND strings SR. Each of the NAND strings SR includes, for example, eight memory cells MT0 to MT7 and two select transistors ST1 and ST2. The number of memory cells and select transistors in the NAND string SR may be different from the example of FIG. 2.

Figure 3:
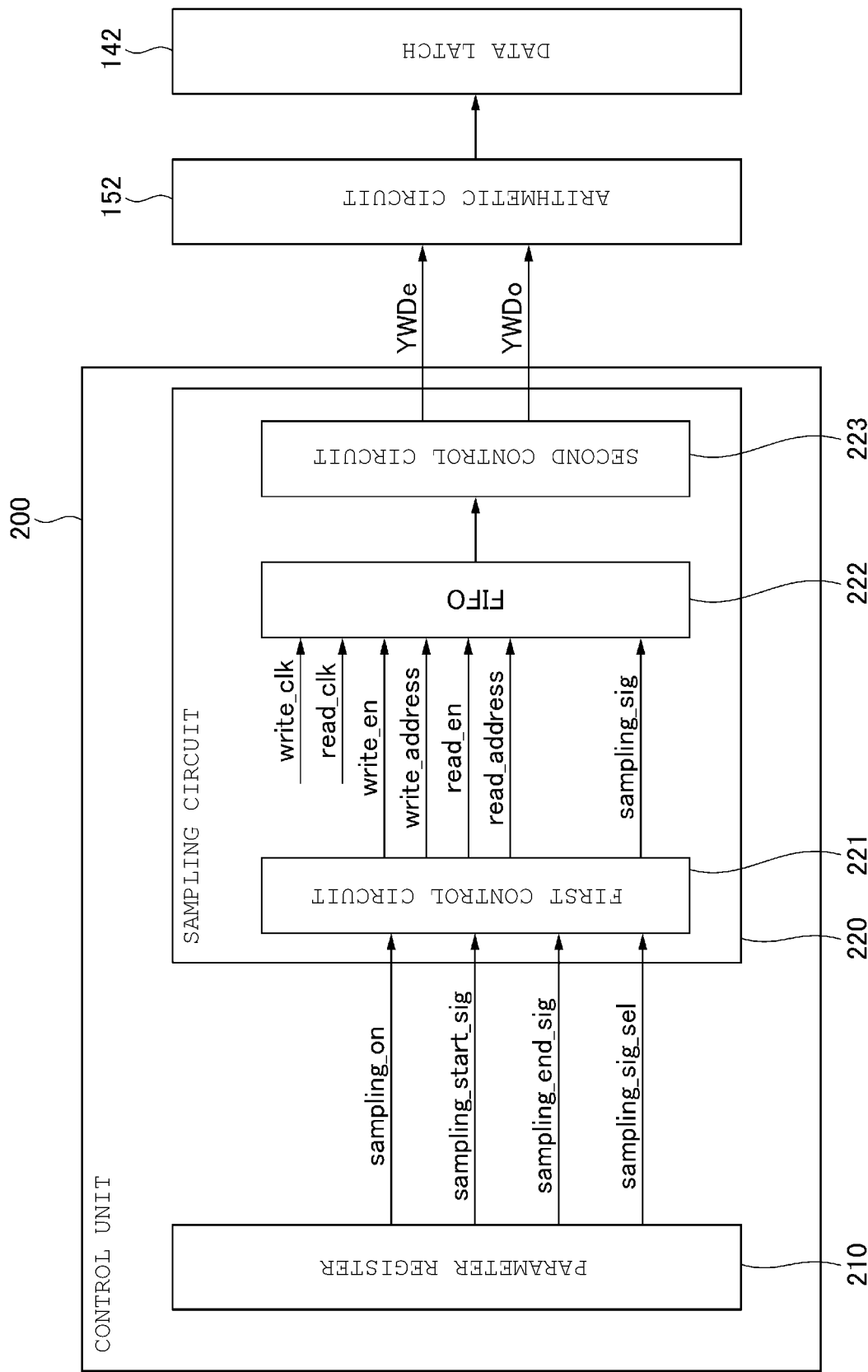
FIG. 3 is a diagram schematically illustrating a configuration of a control unit in the semiconductor storage device according to the first embodiment.

The plurality of string units SU0 to SU3 form one block as a whole, and a plurality of such blocks are provided in the memory cell array 111. In FIG. 3, only a single block is illustrated, and illustrations of other blocks are omitted.

In the following description, the string units SU0 to SU3 may be also referred to as a "string unit SU" without distinguishing among the respective string units SU0 to SU3. In the same manner, the memory cells MT0 to MT7 may be also referred to as a "memory cell MT" without distinguishing among the respective memory cells MT0 to MT7, and the select transistors ST1 and ST2 may be also referred to as a "select transistor ST" without distinguishing between the respective select transistors ST1 and ST2.

Each string unit SU includes the same number of NAND strings SR as the number of bit lines BL0 to BL (N−1) (N is a positive integer). The memory cells MT0 to MT7 in the NAND string SR are arranged in series between a source of the select transistor ST1 and a drain of the select transistor ST2. A drain of the select transistor ST1 is connected to one of the bit lines BL. A source of the select transistor ST2 is connected to a source line SL. In the following description, the bit lines BL0 to BL (N−1) may be also referred to as a "bit line BL" without distinguishing among the respective bit lines BL0 to BL (N−1).

Each memory cell MT is configured as a transistor including a charge storage layer at a gate portion. An amount of charge stored in the charge storage layer corresponds to data stored in the memory cell MT. The memory cell MT may be a charge trap type using, for example, a silicon nitride film as the charge storage layer, or a floating gate type using, for example, a silicon film as the charge storage layer.

Gates of a plurality of select transistors ST1 in the string unit SU0 are all connected to a select gate line SGD0. The select gate line SGD0 is a line to which a voltage for switching the opening and closing of each select transistor ST1 is applied. In the same manner, the string units SU1 to SU3 also include select gate lines SGD1 to SGD3 for applying a voltage to the select transistor ST1, corresponding to the respective string units SU1 to SU3.

Gates of a plurality of select transistors ST2 in the string unit SU0 are all connected to a select gate line SGS0. The select gate line SGS0 is a line to which a voltage for switching the opening and closing of each select transistor ST2 is applied. In the same manner, the string units SU1 to SU3 also include select gate lines SGS1 to SGS3 for applying a voltage to the select transistor ST2, corresponding to the respective string units SU1 to SU3.

Respective gates of the memory cells MT0 to MT7 are connected to word lines WL0 to WL7 via the charge storage layer described above. The word lines WL0 to WL7 are lines to which voltages are applied for the purpose of switching the opening and closing of the memory cells MT0 to MT7.

Writing and reading the data to and from the memory cell array 111 are collectively performed with respect to a plurality of memory cells MT connected to any one of the word lines WL in any one of the string units SU for each unit referred to as a "page". On the other hand, erasing the data in the memory cell array 111 is collectively performed with respect to all the memory cells MT in the block. Since various well-known methods may be adopted as a specific method for writing, reading, and erasing the data, the detailed description thereof will be omitted.

The configuration of the memory cell array 111 is not limited to the above-described configuration, and various well-known configurations may be adopted. For example, the memory cell array 111 may have a plurality of memory cells MT which are arranged in three dimensions, or may have a plurality of memory cells MT which are arranged in two dimensions.

The memory cell array 111 may be referred to as a "first memory cell array" in the description of the embodiment. The memory cell array 112 may be referred to as a "second memory cell array" in the description of the embodiment. As described above, the semiconductor storage device 10 includes two memory cell arrays for storing data, and these two memory cell arrays are respectively provided on the planes 101 and 102.

Referring back to FIG. 1, a peripheral configuration of the memory cell arrays 111 and 112 of the semiconductor storage device 10 will be described. The row decoder 121, the sense amplifier 131, the data latch 141, and an arithmetic circuit 151 are provided around the memory cell array 111 of the plane 101.

The row decoder 121 is a circuit including a plurality of switch groups (not illustrated) configured to individually apply a voltage generated by a voltage generation circuit 13, which will be described later, to each word line WL. An operation of the row decoder 121 is controlled by a logic circuit 14 and a control unit 200, both of which will be described later.

The row decoder 121 of the embodiment is provided on opposite sides of the memory cell array 111 along a direction in which the word line WL extends. Instead of the above-described formation, the row decoder 121 may be provided only on one side along the direction in which the word line WL extends.

The sense amplifier 131 is a circuit that adjusts the voltage applied to each bit line BL. When writing data to the memory cell array 111, the sense amplifier 131 adjusts the voltage applied to the bit line BL according to the data written to each memory cell MT. The voltage is a voltage generated by the voltage generation circuit 13. When reading data from the memory cell array 111, the sense amplifier 131 acquires the data stored in each memory cell MT based upon the voltage of each bit line BL. An operation of the sense amplifier 131 is controlled by a logic circuit 15 and the control unit 200, both of which will be described later.

The data latch 141 is a storage device including a plurality of latch circuits (not illustrated). The data written to the memory cell array 111 is inputted from the controller 20 to an input and output unit 12 which will be described later, and then temporarily latched in the data latch 141, after which the data is written to the memory cell array 111 via the sense amplifier 131 from the data latch 141. The data read from the memory cell array 111 by the sense amplifier 131 is temporarily latched in the data latch 141, and then transmitted to the controller 20 via the input and output unit 12. As described above, the data latch 141 is used as a storage place for temporarily storing each of the data written to the memory cell array 111 and the data read from the memory cell array 111.

The arithmetic circuit 151 is a circuit that performs an arithmetic process of the data stored in the sense amplifier 131 and the data latch 141. The data transmitted and received between the sense amplifier 131 and the data latch 141 and the data transmitted and received between the data latch 141 and the input and output unit 12 are subjected to the arithmetic process by the arithmetic circuit 151 as necessary.

The row decoder 122, the sense amplifier 132, the data latch 142, and an arithmetic circuit 152 are provided around the memory cell array 112 of the plane 102. The row decoder 122, the sense amplifier 132, the data latch 142, and the arithmetic circuit 152 of the plane 102 correspond respectively to the row decoder 121, the sense amplifier 131, the data latch 141, and the arithmetic circuit 151 of the plane 101. Since functions of the row decoder 122, and the like provided on the plane 102 are the same as functions of the row decoder 121, and the like provided on the plane 101, duplicate description will be omitted.

The data latch 141 may be referred to as a "first data latch" in the description of the embodiment. The data latch 142 may be referred to as a "second data latch" in the description of the embodiment. As described above, the semiconductor storage device 10 includes two data latches for temporarily storing the data, and these two data latches are respectively provided on the planes 101 and 102.

As described above, the memory cell array and the data latches are respectively and individually provided on the plurality of planes provided in the semiconductor storage device 10. Reading and writing the data from and to the plane 101 and reading and writing the data from and to the plane 102 can be performed independently of each other. For example, it is possible to read the data from the memory cell array 112 on the plane 102 while writing the data to the memory cell array 111 on the plane 101. While writing the data to the plane 101, an operation of the plane 102 at that time can be inactive.

A conversion unit 11, the input and output unit 12, the voltage generation circuit 13, the logic circuits 14 and 15, and the control unit 200 are provided around the planes 101 and 102 of the semiconductor storage device 10.

The conversion unit 11 is a conversion circuit for performing serial and parallel conversion with respect to data transmitted and received between the input and output unit 12 and the planes 101 and 102.

The input and output unit 12 is a circuit serving as an interface when communication with the controller 20 is performed. The controller 20 inputs to the input and output unit 12 various commands, data, and addresses for instructing the writing of the data to the memory cell array 111 and the reading of the data from the memory cell array 111. The data read from the memory cell array 111 is transmitted from the input and output unit 12 to the controller 20.

The input and output unit 12 outputs a signal indicating a state of the semiconductor storage device 10. The signal includes ready and busy signals. The ready signal is a signal indicating a state in which the semiconductor storage device 10 can receive a command. The busy signal is, for example, a signal indicating a state in which an operation based upon a previous command is not completed and thus the semiconductor storage device 10 cannot receive a next command.

A bus for transmitting the signal inputted and outputted via the input and output unit 12 to each unit is formed inside the semiconductor storage device 10, and an illustration of the bus is omitted in FIG. 1.

The voltage generation circuit 13 is a circuit for generating a voltage for operating each unit of the semiconductor storage device 10 based upon a power supply voltage inputted from the outside. A voltage applied to each select transistor ST via the select gate lines SGD0 to SGD3 and SGS0 to SGS3, a voltage applied to each memory cell MT via the word lines WL0 to WL7, and a voltage applied to each string unit SU via the bit line BL are all generated by the voltage generation circuit 13. The voltage generation circuit 13 may be divided into a plurality of circuits depending on a magnitude of the generated voltage.

The logic circuits 14 and 15 are circuits that control operations of the row decoders 121 and 122, and the sense amplifiers 131 and 132 in cooperation with the control unit 200 which will be described later. The logic circuit 14 performs control of a signal process along a row direction, that is, to perform control of the row decoders 121 and 122. The logic circuit 15 performs control of a signal process along a column direction, that is, to perform control of the sense amplifiers 131 and 132 and the data latches 141 and 142. The logic circuit 14 and the logic circuit 15 do not have to be separately provided, and may be configured as a single circuit. The logic circuits 14 and 15 also may be provided for each of the planes 101 and 102.

The control unit 200 is a control circuit that controls the overall operation of the semiconductor storage device 10. The control unit 200 performs a process necessary for writing and reading the data to and from the memory cell arrays 111 and 112 based upon a command, an address, and data inputted from the controller 20.

As described above, the semiconductor storage device 10 includes the peripheral circuit unit that writes the data to the memory cell arrays 111 and 112 and reads data from the memory cell arrays 111 and 112, as well as the memory cell arrays 111 and 112 that store the data. As used herein, "peripheral circuit unit" includes the sense amplifiers 131 and 132, the data latches 141 and 142, and the arithmetic circuits 151 and 152 provided on the planes 101 and 102. The peripheral circuit unit also includes the conversion unit 11, the input and output unit 12, the voltage generation circuit 13, the logic circuits 14 and 15, and the control unit 200 provided around the planes 101 and 102.

When any defect in the semiconductor storage device 10 such as, for example, failure of writing the data to the memory cell array 111 occurs, it is required to specify a cause of the defect and take necessary measures thereagainst. In order to determine the cause of the defect, for example, a signal inputted and outputted via the input and output unit 12 in a simulation is compared with a signal inputted and outputted in an actual machine.

However, when the cause of the defect depends on, for example, a signal timing of each unit, it can be considered that the defect cannot be reproduced even though the simulation is performed, and the cause of the defect cannot be quickly determined.

The semiconductor storage device 10 according to the embodiment has a function of sampling a signal of a predetermined node in the peripheral circuit unit and outputting sampling data to the outside. By performing the function, an internal state of the semiconductor storage device 10 can be determined at the time the defect occurs. As a result, since ambiguity is reduced when the simulation is executed, the simulation can be performed more accurately, and the cause of the defect can be determined in a short time. A process of sampling the signal of the predetermined node in the peripheral circuit unit is also hereinafter referred to as a "sampling process". Data acquired by the sampling process is also hereinafter referred to as "sampling data".

A configuration for executing the sampling process will be described with reference to FIG. 3. In FIG. 3, a part of the peripheral circuit unit including the control unit 200 is schematically illustrated.

The control unit 200 includes a parameter register 210 and a sampling circuit 220. In FIG. 3, only the configuration necessary for executing the sampling process in the control unit 200 is schematically illustrated, and other configurations in the control unit 200 are not illustrated.

The parameter register 210 is a register in which various parameters for controlling an operation of the control unit 200 are written. The controller 20 writes the parameters to the parameter register 210. The controller 20 writes the parameters to the parameter register 210 by transmitting a write command to the input and output unit 12. The control unit 200 performs various operations based upon values of the parameters written to the parameter register 210.

A plurality of parameters are written to the parameter register 210. The plurality of parameters include a parameter for setting the operation of the control unit 200 in normal control unrelated to the sampling process, as well as a parameter for setting the operation of the control unit 200 in the sampling process. The "normal control" is, for example, control performed for writing and reading the data to and from the memory cell arrays 111 and 112. Contents of the parameters written to the parameter register 210 will be described later.

The sampling circuit 220 is a unit that executes the sampling process. The sampling circuit 220 includes a first control circuit 221, a data storage unit 222, and a second control circuit 223.

The first control circuit 221 is a unit that executes an actual operation of the sampling process, that is, the writing of the sampling data to the data storage unit 222 which will be described later, based upon the parameters written to the parameter register 210.

The data storage unit 222 is a storage device configured to perform a so-called "first in first out" (FIFO) operation, and is, for example, an SRAM or a DRAM. The data storage unit 222 is used as a temporary storage place for the sampling data during the execution of the sampling process.

During the execution of the sampling process, the sampling data is written to the data storage unit 222. In a period after the start of writing the data to the data storage unit 222 and before the sampling process is completed, the sampling data written to the data storage unit 222 is sequentially read and written to the data latch 142. That is, during the execution of the sampling process, the writing of the sampling data to the data storage unit 222 and the transfer of the sampling data to the data latch 142 are performed in parallel. After completion of the sampling process, all of the sampling data are stored in the data latch 142.

The first control circuit 221 controls the writing of the sampling data to the data storage unit 222 and the reading of the sampling data from the data storage unit 222.

The second control circuit 223 is a unit that performs a process of transferring the sampling data read from the data storage unit 222 to the data latch 142. The second control circuit 223 transfers the sampling data read from the data storage unit 222 to the data latch 142 via the arithmetic circuit 152. The 64-bit sampling data read from the data storage unit 222 is divided into four pieces of 16-bit data, and then the four pieces thereof are transferred to the arithmetic circuit 152 via each of a "YWDe" which is a bus for even-numbered bits and a "YWDo" which is a bus for odd-numbered bits. The arithmetic circuit 152 reconverts the four pieces of 16-bit data into original 64-bit data, and then transfers the reconverted data to the data latch 142, and the reconverted data is stored in the data latch 142.

In the same manner as that of the data latch 141 described above, the data latch 142 is used as a storage place for temporarily storing each of the data written to the memory cell array 112 and the data read from the memory cell array 112. The controller 20 can read the data stored in the data latch 142 by transmitting a register read command defined by an interface standard, to the input and output unit 12.

In the embodiment, the above-described data latch 142, that is, an existing register in which data is read and written under the normal control is used as the storage place for the data acquired by the sampling process. Therefore, it is possible to acquire the sampling data by the controller 20 without separately providing a dedicated interface circuit.

The parameters written to the parameter register 210 will be described with reference to FIG. 3. The parameters include "sampling_on", "sampling_start_sig", "sampling_end_sig", and "sampling_sig_sel".

The "Sampling_on" parameter is a 1-bit parameter that takes a value of 0 or 1. When the value of the "sampling_on" parameter is 1, a function of the sampling process is enabled.

When the value of the "sampling_on" parameter is 0, the function of the sampling process is disabled. That is, the first control circuit 221 executes the sampling process only during the period when the value of the "sampling_on" parameter becomes 1.

The "sampling_start_sig" parameter is a parameter that specifies the signal that is to be used as a trigger for starting the sampling process. A storage device, which is not illustrated, in the control unit 200 stores in advance a correspondence relationship between a value of the "sampling_start_sig" parameter and the signal at a predetermined node of the peripheral circuit unit. For example, the correspondence relationship therebetween is shown in a frame B1 of FIG. 5. The "predetermined node of the peripheral circuit unit" described above is a candidate of the trigger for starting the sampling process. The value of the "sampling_start_sig" parameter may be stored in the memory cell array 111 or 112. The same also applies to the "sampling_end_sig" parameter.

The first control circuit 221 of the sampling circuit 220 sets the signal to be used as the trigger for starting the sampling process based upon the "sampling_start_sig" parameter. For example, in the example shown in the frame B1 of FIG. 5, when 0h is set as the value of the "sampling_start_sig" parameter, the signal at a node of P_CLK is regarded as the signal to be used as the trigger for starting the sampling process. In this case, the sampling process starts at a timing when the value of the node of P_CLK changes from 0 to 1.

In the embodiment, the "sampling_start_sig" parameter is set as a 4-bit parameter. That is, a range of 4 bits of the parameter register 210 is set as the "sampling_start_sig" parameter. Therefore, a maximum of 16 nodes can be set as candidates of the trigger for starting the sampling process. In alternative embodiments, the number of bits allocated for the "sampling_start_sig" parameter in the parameter register 210 may be different from the above-described number.

The "Sampling_end_sig" parameter is a parameter that specifies the signal to be used as a trigger for ending the sampling process. A storage device, which is not illustrated, in the control unit 200 stores in advance a correspondence relationship between a value of the "sampling_end_sig" parameter and the signal at a predetermined node of the peripheral circuit unit. For example, the correspondence relationship therebetween is shown in a frame B2 of FIG. 5. The "predetermined node of the peripheral circuit unit" described above is a candidate of the trigger for ending the sampling process.

The first control circuit 221 of the sampling circuit 220 sets the signal to be used as the trigger for ending the sampling process based upon the "sampling_end_sig" parameter. For example, in the example shown in the frame B2 of FIG. 5, when 0h is set as the value of the "sampling_end_sig" parameter, the signal at a node of prog_end is regarded as the signal to be used as the trigger for ending the sampling process. In this case, the sampling process ends at a timing when the value of the node of prog_end changes from 0 to 1.

In the embodiment, the "sampling_end_sig" parameter is set as a 4-bit parameter. That is, a range of 4 bits of the parameter register 210 is set as the "sampling_end_sig" parameter. Therefore, a maximum of 16 nodes can be set as candidates of the trigger for ending the sampling process. In alternative embodiments, the number of bits allocated for the "sampling_end_sig" parameter in the parameter register 210 may be different from the above-described number.

The "sampling_sig_sel" parameter is a parameter that specifies a node which becomes a sampling target in the sampling process. A storage device, which is not illustrated, in the control unit 200 stores in advance a correspondence relationship between a value of the "sampling_sig_sel" parameter and a predetermined node of the peripheral circuit unit. For example, the correspondence relationship therebetween is shown in a frame B3 of FIG. 5. The "predetermined node of the peripheral circuit unit" described above is a candidate of the node which becomes the sampling target.

The node which becomes the sampling target can be appropriately selected from the nodes of the peripheral circuit unit. The node may be a node outside the control unit 200, or may be a node inside the control unit 200.

The first control circuit 221 of the sampling circuit 220 sets the node which becomes the sampling target based upon the "sampling_sig_sel" parameter. For example, in the example shown in the frame B3 of FIG. 5, when 0h is set as the value of the "sampling_sig_sel" parameter, a node of PROG_CS becomes the sampling target. As a candidate of the node which becomes the sampling target, it is desirable to set a node that can obtain valid information for the simulation. In the embodiment, the "sampling_sig_sel" parameter is set as a 4-bit parameter. That is, a range of 4 bits of the parameter register 210 is set as the "sampling_sig_sel" parameter. Therefore, a maximum of 16 nodes can be set as candidates of the sampling target. In alternative embodiments, the number of bits allocated for the "sampling_sig_sel" parameter in the parameter register 210 may be different from the above-described number.

The first control circuit 221 executes the sampling process based upon the "sampling_on" parameter, the "sampling_start_sig" parameter, the "sampling_end_sig" parameter, and the "sampling_sig_sel" parameter stored in the parameter register 210.

When the value of the "sampling_on" parameter becomes 1, the first control circuit 221 starts the sampling process at the timing when the value of the node specified by the "sampling_start_sig" parameter changes from 0 to 1. Hereinafter, the first control circuit 221 repeatedly transmits each of a "sampling_sig" signal, a "write_address" signal, and a "write_en" signal.

The "sampling_sig" signal is a signal containing the sampling data acquired by the sampling process. In the embodiment, as the "sampling_sig" signal, a signal having a maximum size up to 64 bits can be set by the above-described "sampling_sig_sel" parameter.

The "write_address" signal is a signal containing an address when data is stored in the data storage unit 222. The "write_en" signal is a signal for executing the writing of the sampling data to the data storage unit 222.

After that, the first control circuit 221 sequentially performs a process of writing the sampling data contained in the "sampling_sig" signal to the address contained in the "write_address" signal in the data storage unit 222. Acquisition of the sampling data and writing the sampling data to the data storage unit 222 are performed based upon a "write_clk" signal. The "write_clk" signal is a clock signal inputted to the data storage unit 222 at a predetermined cycle.

At a predetermined timing after the writing of the sampling data to the data storage unit 222 starts, the first control circuit 221 starts the process of transferring the sampling data from the data storage unit 222 to the data latch 142. At this time, the first control circuit 221 repeatedly transmits each of a "read_address" signal and a "read_en" signal.

The "read_address" signal is a signal containing an address that is used when the reading of the sampling data from the data storage unit 222 is executed. The "read_en" signal is a signal for executing the reading of the sampling data from the data storage unit 222.

After that, the second control circuit 223 sequentially performs a process of transferring the sampling data stored in the address contained in the "read_address" signal in the data storage unit 222 to the data latch 142 via the arithmetic circuit 152.

Figure 4:
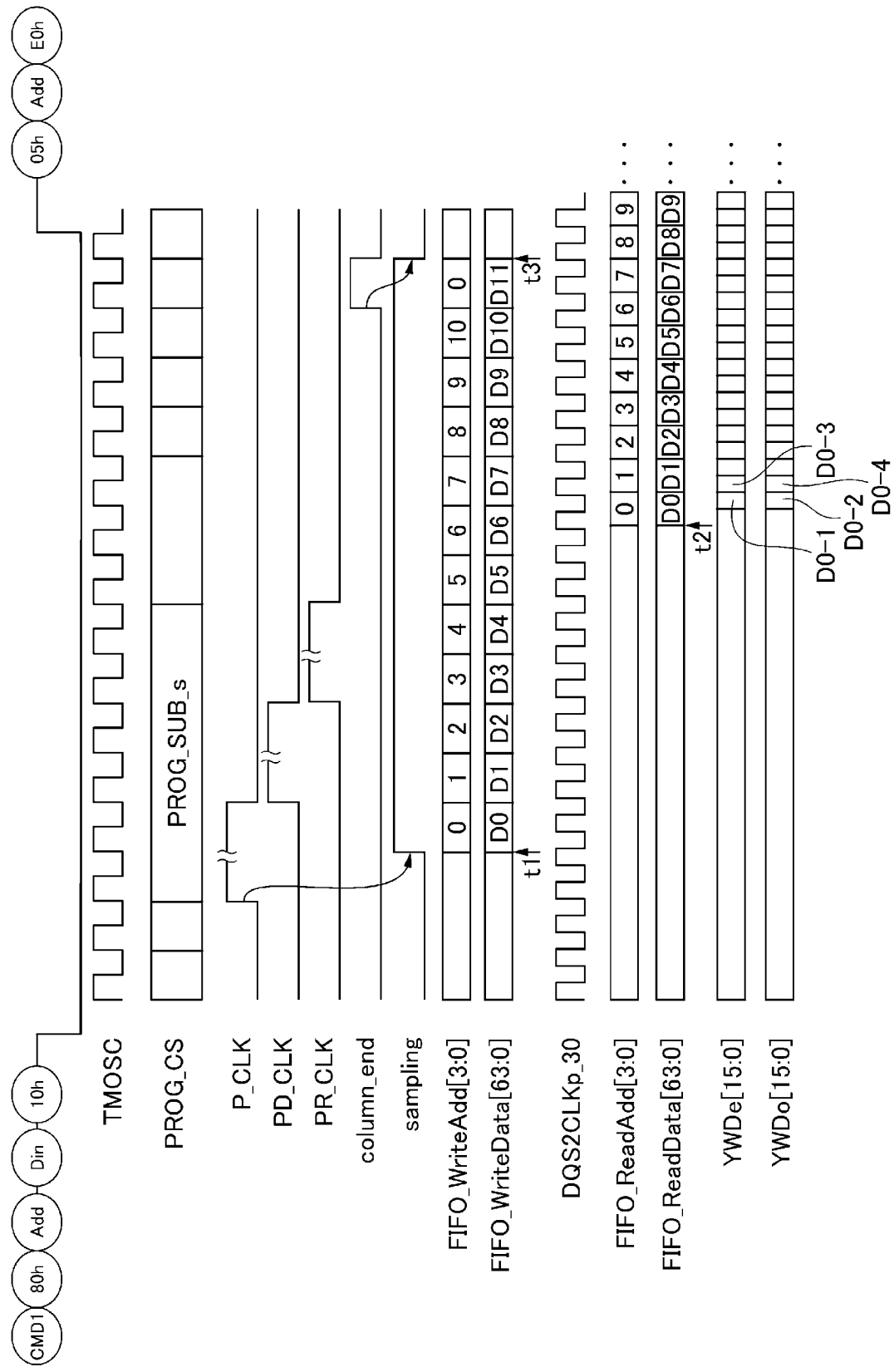
FIG. 4 is a timing diagram illustrating a flow of sampling data inside the semiconductor storage device according to the first embodiment.

FIG. 4 is a timing diagram illustrating a flow of the sampling data when the sampling process is performed as described above. What is illustrated at a top stage of FIG. 4 is a timing diagram of a command sequence transmitted from the controller 20 to the semiconductor storage device 10. In this example, "CMD1", "80h", "Add", "Din", and "10h" are sequentially transmitted from the controller 20. The "CMD1", the "80h", the "Add", the "Din", and the "10h" are transmitted thereto as instructions for writing the data to the memory cell array 111 of the plane 101.

The "CMD1" is a prefix indicating that a signal transmitted following the "CMD1" is a command for instructing the writing or reading of the data to and from the memory cell array 111. The "80h" is a signal for instructing the writing of the data to the memory cell array 111. The "Add" is a signal for designating an address which becomes a write destination of data. The "Din" is a signal for indicating the data to be written to the address specified by the "Add". The "10h" is a signal for executing the writing of the data "Din" to the memory cell array 111 at the address specified by the "Add".

After the "10h" is transmitted from the controller 20, a process of writing the data to the memory cell array 111 is performed. After the process thereof is completed, that is, after the ready signal is asserted from the input and output unit 12, in the example of FIG. 4, the controller 20 sequentially transmits "05h", "Add", and "E0h". The "05h", the "Add", and the "E0h" are transmitted as instructions for reading the data from the plane 101.

The "05h" is a signal for instructing the reading of the data from the memory cell array 111. The "Add" is a signal for designating an address which becomes a reading source of the data. The "E0h" is a signal for executing the reading of the data from the memory cell array 111 from the address "Add". After the "E0h" is transmitted from the controller 20, a process of reading the data from the memory cell array 111 is performed. The data read from the memory cell array 111 is temporarily stored in the data latch 141 of the plane 101, and then transferred from the data latch 141 to the controller 20 via the input and output unit 12.

In the example of FIG. 4, the sampling process is executed in a period during which the writing of the data to the memory cell array 111 is executed, that is, a period between after the "10h" is transmitted from the controller 20 and before the "05h" is transmitted. During this period, the plane 101 is in operation for writing and the plane 102 is inactive.

"TMOSC" shown in FIG. 4 is a reference clock signal for operating each unit including the logic circuits 14 and 15. In the semiconductor storage device 10, a plurality of individual clock signals for operating the respective units are generated based upon the reference clock signal. All of "P_CLK", "PD_CLK", and "PR_CLK" shown in FIG. 4 are clock signals generated based upon the "TMOSC".

"PROG_CS" shown in FIG. 4 represents operation steps of the logic circuits 14 and 15 when performing the writing of the data to the memory cell array 111. In the example of FIG. 4, the data is being written to the memory cell array 111 in a period during which characters "PROG_SUB_s" are added. This process starts at a timing when the clock signal of the "P_CLK" changes from 0 to 1.

In the example of FIG. 4, the signal of the "P_CLK" is set as the trigger for starting the sampling process based on the "sampling_start_sig" parameter written in advance to the parameter register 210. Therefore, when the clock signal of the "P_CLK" changes from 0 to 1 and the operation of the "PROG_SUB_s" starts, the signal for starting the sampling process changes from 0 to 1 inside the sampling circuit 220. The signal is shown as "sampling" in FIG. 4.

In the example of FIG. 4, a signal of "column_end" is set as the trigger for ending the sampling process based on the "sampling_end_sig" parameter written in advance to the parameter register 210. The "column_end" is a signal that changes from 0 to 1 when writing to the last page among the data written to the memory cell array 111 is completed. Therefore, when writing the data to the memory cell array 111 is completed and the signal of the "column_end" changes from 0 to 1, the signal for starting the sampling process, that is, the "sampling" changes from 1 to 0.

The sampling process starts at the same time when the "sampling" becomes 1, and continues until the "sampling" returns to 0. In FIG. 4, the time when the "sampling" becomes 1 is shown as "t1", and the time when the "sampling" returns to 0 is shown as "t3".

"FIFO_WriteAdd [3:0]" in FIG. 4 is an address designated by the "write_address" signal from the first control circuit 221. That is, the "FIFO_WriteAdd [3:0]" is an address for designating the write destination when the sampling data is written to the data storage unit 222. The address has 4 bits of information, and the number of bits of the address may be different therefrom.

"FIFO_WriteData [63:0]" in FIG. 4 is sampling data contained in the "sampling_sig" signal from the first control circuit 221. That is, the "FIFO_WriteData [63:0]" is sampling data written to the address designated by the "FIFO_WriteAdd [3:0]". A data size of the "FIFO_WriteData [63:0]" is 64 bits, which is the same as a data size of the "sampling_sig".

FIG. 4 illustrates a state in which after the time t1 when the "sampling" becomes 1, each data of D0, D1, D2, . . . indicated by the "FIFO_WriteData [63:0]" is written to each address of 0, 1, 2, . . . indicated by the "FIFO_WriteAdd [3:0]" in order. Such writing of the data to the data storage unit 222 is continuously performed up to the time t3 when the "sampling" returns to 0.

In the example of FIG. 4, the process of transferring the sampling data from the data storage unit 222 to the data latch 142 starts at time t2 after the time t1.

"DQS2CLKp_30" shown in FIG. 4 is a clock signal generated for reading the sampling data from the data storage unit 222. The "DQS2CLKp_30" is a clock signal having a shorter cycle than that of the "TMOSC". The sampling data from the data storage unit 222 is read based upon the clock signal having such a short cycle. When the reading of the sampling data from the data storage unit 222 starts immediately after the time t1, the reading of the sampling data therefrom catches up with the writing of the sampling data to the data storage unit 222, such that the transfer of the sampling data to the data latch 142 may be stopped. Therefore, in the embodiment, the reading of the sampling data therefrom starts at the time t2 which is a timing later than the time t1, thereby preventing the reading of the sampling data therefrom from catching up with the writing of the sampling data thereto.

"FIFO_ReadAdd [3:0]" in FIG. 4 is an address designated by the "read_address" signal from the first control circuit 221. That is, "FIFO_ReadAdd [3:0]" is an address for designating a reading source when the sampling data is read from the data storage unit 222 and transferred to the data latch 142. The address has 4 bits of information, and the number of bits of the address may be different therefrom.

"FIFO_ReadData [63:0]" in FIG. 4 is sampling data read from the address designated by the "FIFO_ReadAdd [3:0]". A data size of the "FIFO_ReadData [63:0]" is 64 bits, which is the same as a data size of the "FIFO_WriteData [63:0]".

FIG. 4 illustrates a state in which after the time t2, each data of D0, D1, D2, . . . indicated by the "FIFO_ReadData [63:0]" is read from each address of 0, 1, 2, . . . indicated by the "FIFO_ReadAdd [3:0]" in order. Such reading of the data from the data storage unit 222 and transfer of the data to the data latch 142 are continuously performed until the transfer of all the data is completed even after the time t3 when the "sampling" returns to 0.

The sampling data read from the data storage unit 222 and transferred to the data latch 142 is transferred to and written to the data latch 142 via the arithmetic circuit 152 as described above with reference to FIG. 3. The sampling data is 64-bit data as a whole, and at the time of the transfer, the sampling data is transferred in a state of being divided into four 16-bit data. Each 16-bit data is transferred to the arithmetic circuit 152 via each of the "YWDe" which is the bus for even-numbered bits, and the "YWDo" which is the bus for odd-numbered bits.

"D0-1", "D0-2", "D0-3", and "D0-4" shown in FIG. 4 are obtained by converting sampling data "D0" read from an address "0" of the data storage unit 222 into four 16-bit data. Of the four 16-bit data, "D0-1" and "D0-3" are transferred to the arithmetic circuit 152 via the "YWDe" which is the bus for even-numbered bits. "D0-2" and "D0-4" are transferred to the arithmetic circuit 152 via the "YWDo" which is the bus for odd-numbered bits. After that, after the four 16-bit data is changed to the original 64-bit data in the arithmetic circuit 152, the original 64-bit data is transferred to the data latch 142 and stored therein. Each sampling data of D1, D2, . . . is also transferred to and stored in the data latch 142 in the same manner as described above.

Figure 5:
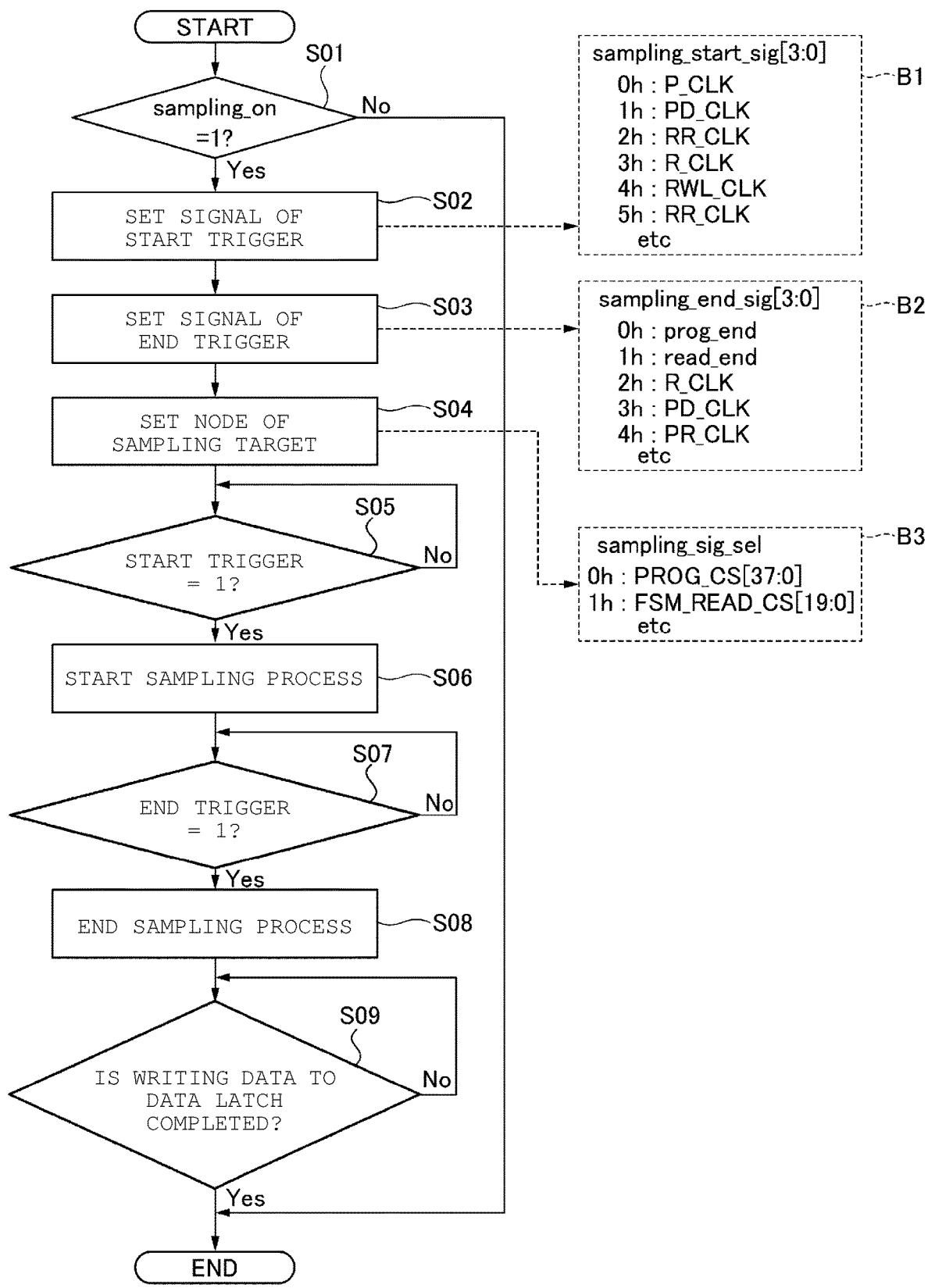
FIG. 5 is a flowchart illustrating a flow of a process executed by the control unit in the semiconductor storage device according to the first embodiment.

In order to implement the sampling process as described above, a flow of a specific process executed by the sampling circuit 220 will be described with reference to a flowchart of FIG. 5.

First, in S01, it is determined whether or not the value of the "sampling_on" parameter among the respective parameters written to the parameter register 210 is 1. When the value of the "sampling_on" parameter is 0, a series of processes illustrated in FIG. 5 is terminated without executing the sampling process. When the value of the "sampling_on" parameter is 1, the process proceeds to S02.

In S02, a process of setting the signal used as the trigger for starting the sampling process is performed based upon the value of the "sampling_start_sig" parameter among the parameters written to the parameter register 210. As described above, in the control unit 200, the correspondence relationship between the value of the "sampling_start_sig" parameter and the signal at a predetermined node of the peripheral circuit unit is stored in advance as shown in the example shown in the frame B1. By referring to the correspondence relationship therebetween, the sampling circuit 220 performs a process of setting the signal at the node corresponding to the value of the "sampling_start_sig" parameter as the trigger for starting the sampling process.

In S03 following S02, the signal used as the trigger for ending the sampling process is set based upon the value of the "sampling_end_sig" parameter among the parameters written to the parameter register 210. As described above, in the control unit 200, the correspondence relationship between the value of the "sampling_end_sig" parameter and the signal at a predetermined node of the peripheral circuit unit is stored in advance as shown in the example shown in the frame B2. By referring to the correspondence relationship therebetween, the sampling circuit 220 performs a process of setting the signal at the node corresponding to the value of the "sampling_end_sig" parameter as the trigger for ending the sampling process.

In S04 following S03, a node which becomes the sampling target in the sampling process is set based upon the value of the "sampling_sig_sel" parameter among the parameters written to the parameter register 210. As described above, in the control unit 200, the correspondence between the value of the "sampling_sig_sel" parameter and the predetermined node of the peripheral circuit unit is stored in advance as shown in the example shown in the frame B3. By referring to the correspondence relationship therebetween, the sampling circuit 220 performs a process of setting the node corresponding to the value of the "sampling_sig_sel" parameter as the node which becomes the sampling target.

In S05 following S04, it is determined whether or not a value of the signal set in S02, that is, the signal set as the trigger for starting the sampling process is switched from 0 to 1. When the value of the signal is 0, the process of S05 is executed again. When the value of the signal becomes 1, the "sampling" is set to 1 and the process proceeds to S06.

In S06, the sampling process starts. As described with reference to FIGS. 3 and 4, in the sampling process, the signal of the node set as the sampling target by the "sampling_sig_sel" parameter is sampled, and the sampling data obtained therefrom is stored in the data storage unit 222. After that, the sampling data is transferred to the data latch 142 via the arithmetic circuit 152 and stored therein.

In S07 following S06, it is determined whether or not a value of the signal set in S03, that is, the signal set as the trigger for ending the sampling process is switched from 0 to 1. When the value of the signal is 0, the process of S07 is executed again, and the sampling process is continued. When the value of the signal becomes 1, the "sampling" is set to 0 and the process proceeds to S08. In S08, the sampling process ends. A process of acquiring the sampling data ends in S08. On the other hand, the process of transferring the sampling data from the data storage unit 222 to the data latch 142 continues until the transfer of all the sampling data is completed.

In S09 following S08, it is determined whether or not the transfer of the sampling data to the data latch 142 is completed. When the transfer of the sampling data to the data latch 142 has not completed yet, the process of S09 is executed again. When the transfer of the sampling data to the data latch 142 has completed, the process illustrated in FIG. 5 is terminated. After the process of S09 is completed, a ready signal indicating that the data transfer is completed is transmitted from the semiconductor storage device 10 to the controller 20 in response to a request from the controller 20.

Figure 6:
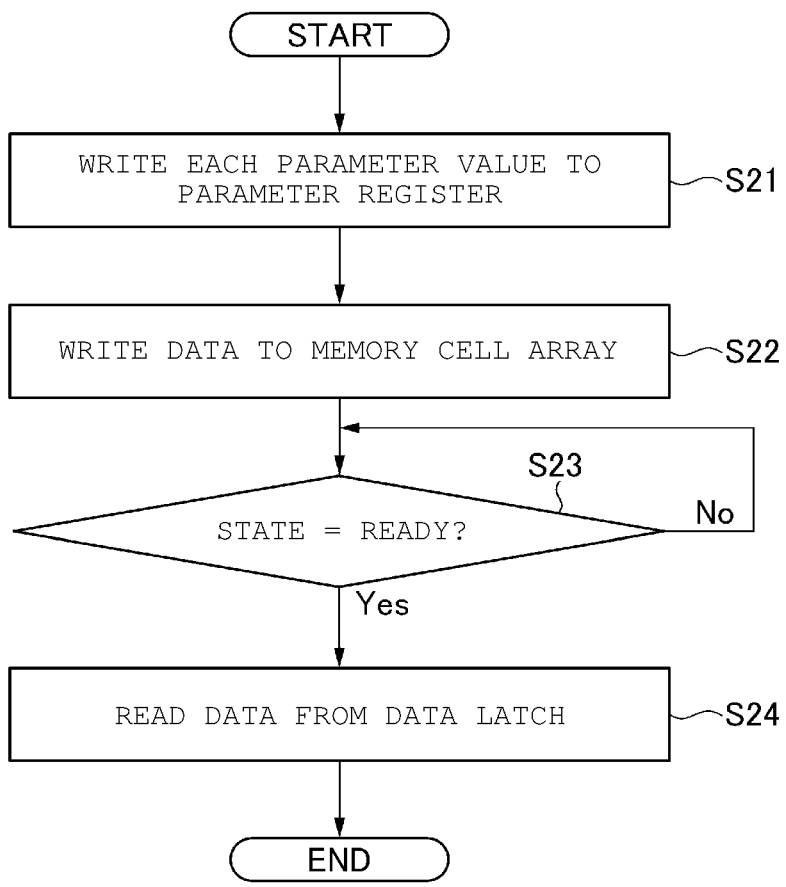
FIG. 6 is a flowchart illustrating a flow of a process executed by a controller.

A flow of a process executed on the side of the controller 20 will be described with reference to a flowchart of FIG. 6. When both the plane 101 and the plane 102 are in an inactive state, that is, when the data is not read or written from or to any one of the memory cell arrays 111 and 112, the controller 20 starts a series of processes illustrated in FIG. 6.

First, in S21, a process of writing the values of the respective parameters to the parameter register 210 is performed. Here, the value of the "sampling_on" parameter is set to 1, and the respective values of the "sampling_start_sig" parameter, the "sampling_end_sig" parameter, and the "sampling_sig_sel" parameter are appropriately set in accordance with data desired to be obtained by the sampling process.

In S22 following S21, a process of starting the writing of the data to the memory cell array 111 is performed. Here, the commands such as the "CMD1" and the "80h" are transmitted to the semiconductor storage device 10 as described in the example shown at the top stage of FIG. 4. Accordingly, the semiconductor storage device 10 starts the writing of the data to the memory cell array 111. At this time, the plane 102 remains inactive, and the plane 101 becomes an operating state by the above-described command.

At a predetermined timing after the plane 101 starts the operation, a signal of a node set by the "sampling_start_sig" parameter, that is, a signal of a node set as the trigger for starting the sampling process changes from 0 to 1. Accordingly, in the semiconductor storage device 10, the sampling process by the sampling circuit 220 starts, and acquired sampling data is transferred to the data latch 142 and written thereto.

In S23 following S22, it is determined whether or not the transfer of the sampling data to the data latch 142 has completed. When a command for checking a state is transmitted from the controller 20 to the semiconductor storage device 10, and a response indicating that the plane 102 is in the ready state is given as the response, it is determined that the transfer of the sampling data is completed. When it is determined that the transfer of the sampling data has not completed yet, the process of S23 is executed again. When it is determined that the transfer of the sampling data has completed, the process proceeds to S24.

In S24, the register read command for instructing the reading of the data from the data latch 142 is transmitted to the input and output unit 12, thereby performing the process of acquiring the sampling data stored in the data latch 142.

As described above, in the semiconductor storage device 10 according to the embodiment, the sampling circuit 220 is configured to execute the sampling process, which is a process of sampling the signal of the predetermined node in the peripheral circuit unit. Accordingly, the signal at the node inside the semiconductor storage device 10 can be acquired by the sampling. The acquired sampling data can be effectively used as information for specifying the cause of the defect occurring in the semiconductor storage device 10. For example, by graphing the sampling data or by performing the simulation using the sampling data, it is possible to quickly specify the cause of the defect occurring in the semiconductor storage device 10.

The sampling circuit 220 of the embodiment executes the sampling process based upon the parameters written to the parameter register 210. Specifically, the sampling circuit 220 sets the signal used as the trigger for starting the sampling process based upon the "sampling_start_sig" parameter. The sampling circuit 220 sets the signal used as the trigger for ending the sampling process based upon the "sampling_end_sig" parameter. The sampling circuit 220 sets the node which becomes the sampling target in the sampling process based upon the "sampling_sig_sel" parameter. Accordingly, the specific contents of the sampling process can be set easily and in detail from the controller 20.

The sampling circuit 220 stores the data acquired by the sampling process in the data latch 142. The data latch 142 is provided as a register for temporarily storing each of the data written to the memory cell array 112 and the data read from the memory cell array 112. As described above, in the embodiment, an existing data latch 142 used for reading and writing normal data is also used as the storage place for the sampling data acquired by the sampling process. Therefore, the controller 20 can easily acquire the sampling data from the semiconductor storage device 10 by using an existing register read command.

The sampling circuit 220 executes the sampling process when the plane 101, which is one plane, is in operation and the plane 102, which is the other plane, is inactive. At that time, the sampling circuit 220 stores the data acquired by the sampling process in the data latch 142 provided in the inactive plane 102. Therefore, the controller 20 can acquire the sampling data via the data latch 142 without affecting the writing and reading of the data to and from the memory cell arrays 111 and 112.

The number of planes in the semiconductor storage device 10 may be 3 or more. Even in this case, the sampling process by the sampling circuit 220 is executed when some of the planes are in operation and some of the planes are inactive.

Contrary to the embodiment, the sampling circuit 220 may execute the sampling process when the plane 102 is in operation and the plane 101 is inactive. In this case, the acquired sampling data may be stored in the data latch 141 in the inactive plane 101.

Both of the sampling process when the plane 101 is in operation and the plane 102 is inactive, and the sampling process when the plane 102 is in operation and the plane 101 is inactive, may be executed. In this case, the data latch which becomes the write destination of the sampling data may be designated by the controller 20 by the value of the parameter register 210 and the command.

In the above description, a state in which the plane 101 is in "operation" indicates a period during which the data is written to or read from the memory cell array of the plane.

A second embodiment will be described. The second embodiment is different from the first embodiment only in the method by which the controller 20 designates the content of the sampling process. In the following, differences from the first embodiment will be mainly described, and description of aspects that are common to the first embodiment will be appropriately omitted.

The sampling circuit 220 according to the second embodiment does not start the sampling process based upon the trigger set by the "sampling_start_sig" parameter, but starts the sampling process at the timing when a specific command is inputted from the input and output unit 12. The above-described "specific command" is a command that can be inputted even though the semiconductor storage device 10 is in a busy state, or may be an original command that is added separately to a command such as the "80h" defined in the NAND standard.

The input and output unit 12 into which various commands including the "specific command" are inputted is a unit to which a command for controlling the operation of the peripheral circuit unit is inputted from the controller 20 as described above, and may be referred to as a "command input unit" in the description of the embodiment.

Figure 7:
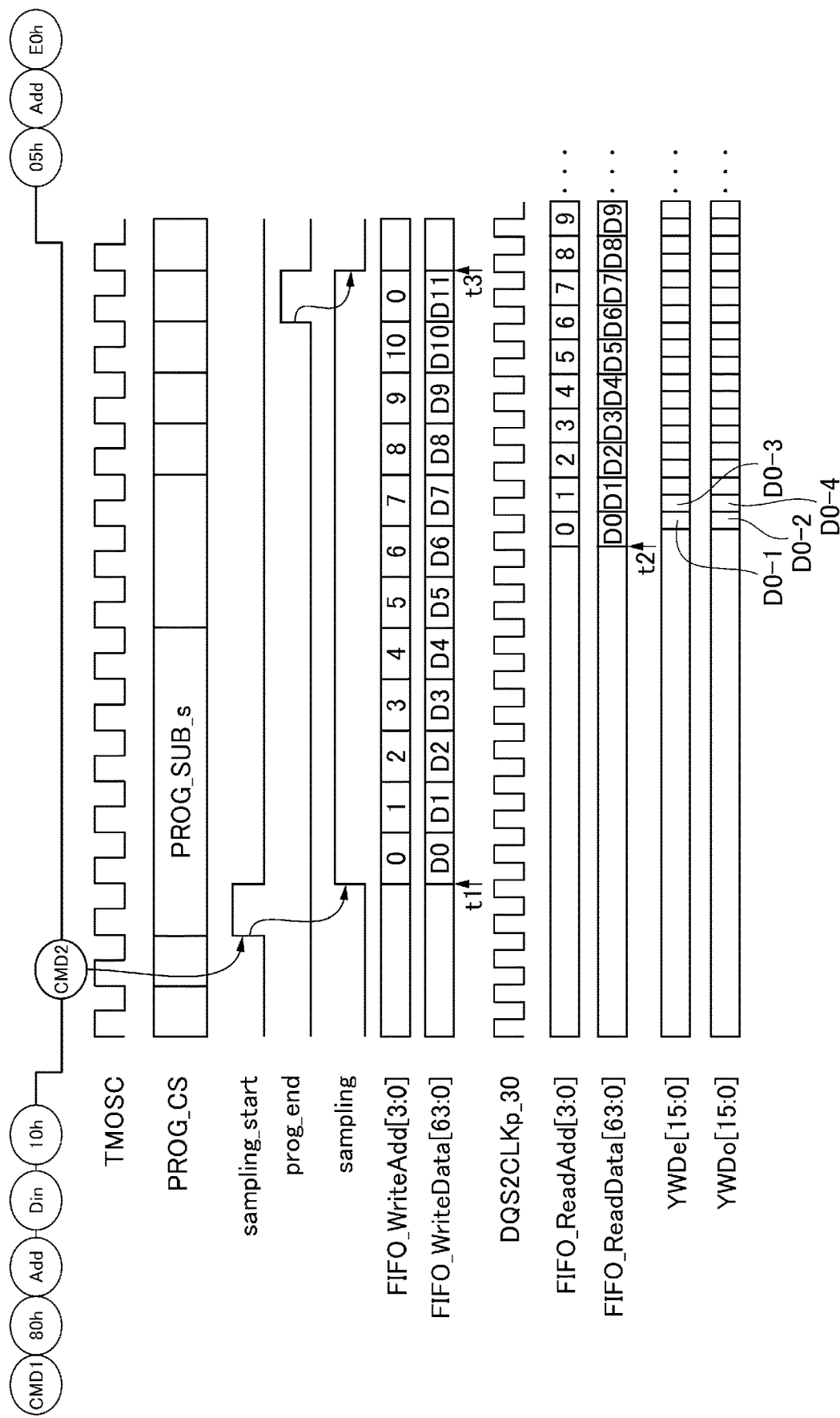
FIG. 7 is a diagram illustrating a flow of sampling data inside a semiconductor storage device according to a second embodiment.

FIG. 7 is a diagram illustrating a flow of sampling data when the sampling process is performed as described above as a timing diagram similar to that of FIG. 4. In the example of FIG. 7, a command "10h" is inputted to the input and output unit 12, and a command "CMD2" is transmitted to the input and output unit 12 from the controller 20 at a timing after the execution of the writing of the data to the memory cell array 111 starts. The "CMD2" is the aforementioned "specific command", that is, a command for instructing the start of the sampling process.

After the command "10h" is inputted to the input and output unit 12, the busy signal is asserted from the input and output unit 12 in a period during which the process of writing the data to the memory cell array 111 is performed. However, since the "CMD2" is the command that can be inputted even though the semiconductor storage device 10 is in the busy state as described above, the sampling circuit 220 can receive the command.

When the "CMD2" is inputted from the controller 20, a signal of "sampling_start" for instructing the start of the sampling process changes from 0 to 1 inside the semiconductor storage device 10. Accordingly, the "sampling" which is a signal for starting the sampling process changes from 0 to 1 inside the sampling circuit 220.

The timing of ending the sampling process is set in advance in the same manner as that of the first embodiment. In the example of FIG. 7, a signal of "prog_end" is set as the trigger for ending the sampling process by the "sampling_end_sig" parameter written in advance to the parameter register 210. The "prog_end" is a signal that changes from 0 to 1 when the writing of the data to the memory cell array 111 is completed. Therefore, when the writing of the data to the memory cell array 111 is completed and the signal of the "prog_end" changes from 0 to 1, the "sampling" changes from 1 to 0.

Also in the embodiment, the sampling process starts at the same time when the "sampling" becomes 1, and continues until the "sampling" returns to 0. In FIG. 7, the time when the "sampling" becomes 1 is indicated as "t1", and the time when the "sampling" returns to 0 is indicated as "t3". The method of transferring the sampling data to the data latch 142 during the execution of the sampling process is the same as that described in the first embodiment.

Figure 8:
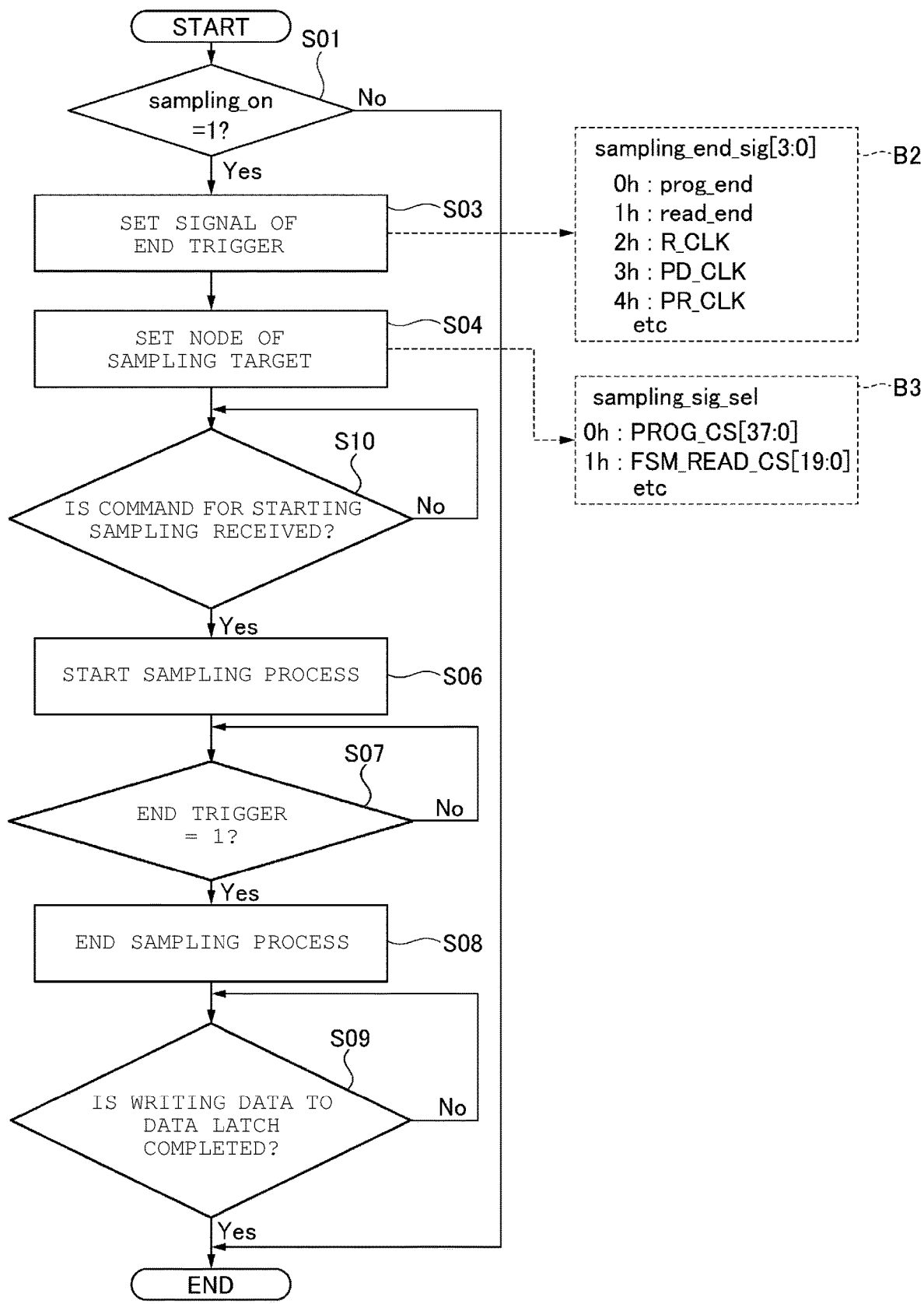
FIG. 8 is a flowchart illustrating a flow of a process executed by a control unit in the semiconductor storage device according to the second embodiment.

A flow of a specific process executed by the sampling circuit 220 in order to implement the sampling process as described above will be described with reference to FIG. 8. A series of processes illustrated in FIG. 8 are executed in place of the series of processes illustrated in FIG. 5. Of the respective steps such as "S01", and the like illustrated in FIG. 8, the steps common to those illustrated in FIG. 5 will be denoted by the same reference signs as those of FIG. 5.

When the value of the "sampling_on" parameter is 1 in S01, the process proceeds to S03 in the embodiment. That is, setting of a start timing using the "sampling_start_sig" parameter is not performed in the embodiment.

After the process of setting the node which becomes the sampling target is performed in S04, the process proceeds to S10 in the embodiment. In S10, it is determined whether or not the command for starting the sampling process, that is, the "CMD2" is inputted from the controller 20. When the "CMD2" is not inputted therefrom yet, the process of S10 is executed again. When the "CMD2" is inputted therefrom, the process proceeds to S06. Processes to be executed after S06 are the same as those in the first embodiment.

As described above, the sampling circuit 220 according to the embodiment executes the sampling process based upon the command inputted to the input and output unit 12 which is the command input unit. Specifically, when the "CMD2" set in advance as the command for starting the sampling process is inputted to the input and output unit 12 from the controller 20, the sampling circuit 220 starts the sampling process. Even in this embodiment, the same effect as that described in the first embodiment is obtained.

Similar to the "CMD2" which is the command for starting the sampling process, a command for terminating the sampling process, and a command for designating the node which becomes the sampling target may be set in advance, and the commands may be used for the sampling process.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first circuit including a data latch, the first circuit configured to perform writing of data to a memory using the data latch and reading of data from the memory using the data latch; and
a second circuit configured to execute a sampling process by which sampling data is collected from a predetermined node of the first circuit and stored in the data latch,
wherein the sampling process is not executed during a period in which the data latch is used for the writing of data and the reading of data.

2. The semiconductor device according to claim 1, further comprising:
a third circuit including a second data latch, the third circuit configured to perform writing of data to a second memory using the second data latch and reading of data from the second memory using the second data latch,
wherein the sampling process is performed during a period in which the second data latch is used for the writing of data to the second memory and the reading of data from the second memory.

3. The semiconductor device according to claim 2, wherein the second circuit is further configured to execute a second sampling process by which sampling data is collected from a predetermined node of the third circuit and stored in the second data latch.

4. The semiconductor device according to claim 1, further comprising:
a register in which one or more sampling parameters are stored,
wherein the second circuit executes the sampling process based on the one or more sampling parameters stored in the parameter register.

5. The semiconductor device according to claim 4, wherein the one or more sampling parameters includes a parameter designating a signal that is used as a trigger for starting the sampling process.

6. The semiconductor device according to claim 5, wherein the signal is one of clock signals used in the semiconductor device.

7. The semiconductor device according to claim 4, wherein the one or more sampling parameters includes a parameter designating a signal that is used as a trigger for ending the sampling process.

8. The semiconductor device according to claim 7, wherein the signal is one of clock signals used in the semiconductor device.

9. The semiconductor device according to claim 4, wherein the one or more sampling parameters includes a parameter designating the predetermined node.

10. The semiconductor device according to claim 4, wherein the one or more sampling parameters are stored in the register during a period in which the data latch is used for neither the writing of data nor the reading of data.

11. The semiconductor device according to claim 4, wherein
the second circuit is configured to receive a command that is used as a trigger for starting the sampling process, and
none of the one or more sampling parameters designates any signal that is used as a trigger for starting the sampling process.

12. An operating method of a semiconductor device comprising a first circuit including a data latch and a second circuit, the method comprising:
performing, with the first circuit, writing of data to a memory using the data latch;
performing, with the first circuit, reading of data from the memory using the data latch; and
executing, with the second circuit, a sampling process by which sampling data is collected from a predetermined node of the first circuit and stored in the data latch,
wherein the sampling process is not executed during a period in which the data latch is used for the writing of data and the reading of data.

13. The method according to claim 12, wherein
the semiconductor device further comprises a third circuit including a second data latch,
the method further comprises:
performing, with the third circuit, writing of data to a second memory using the second data latch; and
performing, with the third circuit, reading of data from the second memory using the second data latch, and
the sampling process is performed during a period in which the second data latch is used for the writing of data to the second memory and the reading of data from the second memory.

14. The method according to claim 13, further comprising:
executing, with the second circuit, a second sampling process by which sampling data is collected from a predetermined node of the third circuit and stored in the second data latch.

15. The method according to claim 12, wherein
the semiconductor device further comprises a register in which one or more sampling parameters are stored, and
the sampling process is executed based on the one or more sampling parameters stored in the parameter register.

16. The method according to claim 15, wherein the one or more sampling parameters includes a parameter designating a signal that is used as a trigger for starting the sampling process.

17. The method according to claim 15, wherein the one or more sampling parameters includes a parameter designating a signal that is used as a trigger for ending the sampling process.

18. The method according to claim 15, wherein the one or more sampling parameters includes a parameter designating the predetermined node.

* * * * *